United States Patent
Lee et al.

(10) Patent No.: US 7,144,777 B2
(45) Date of Patent: Dec. 5, 2006

(54) NON-VOLATILE MEMORY AND MANUFACTURING METHOD THEREOF

(75) Inventors: Tzung-Han Lee, Taipei (TW); Wen-Jeng Lin, Pan-Chiao (TW); Kuang-Pi Lee, Fongyuan (TW); Blue Larn, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 51 days.

(21) Appl. No.: 11/066,994

(22) Filed: Feb. 25, 2005

(65) Prior Publication Data

US 2006/0192241 A1 Aug. 31, 2006

(51) Int. Cl.
*H01L 21/336* (2006.01)

(52) U.S. Cl. .................. 438/266; 438/596; 257/324; 257/326; 257/E29.309; 257/E21.679

(58) Field of Classification Search .............. 438/266, 438/596
See application file for complete search history.

(56) References Cited

U.S. PATENT DOCUMENTS

2004/0155234 A1* 8/2004 Ishimaru et al. ............. 257/10
2004/0201059 A1* 10/2004 Ding ........................ 257/315
2005/0237777 A1* 10/2005 Hsieh et al. ................. 365/63
2006/0011967 A1* 1/2006 Shone ........................ 257/315
2006/0079055 A1* 4/2006 Yang ......................... 438/279

* cited by examiner

Primary Examiner—Trung Dang
(74) Attorney, Agent, or Firm—J.C. Patents

(57) ABSTRACT

A non-volatile memory comprising a substrate, a stacked gate structure, a conductive spacer, an oxide/nitride/oxide layer, buried doping regions, a control gate and an insulating layer. The stacked gate structure is disposed on the substrate. The stacked gate structure comprises a gate dielectric layer, a select gate and a cap layer. The conductive spacer is disposed on the sidewalls of the stacked gate structure. The oxide/nitride/oxide layer is disposed between the conductive spacer and the stacked gate structure and between the conductive spacer and the substrate. The buried doping regions are disposed in the substrate outside the conductive spacer on each side of the stacked gate structure. The control gate is disposed over the stacked gate structure and electrically connected to the conductive spacer. The insulating layer is disposed between the buried doping layer and the control gate.

15 Claims, 4 Drawing Sheets

NON-VOLATILE MEMORY AND MANUFACTURING METHOD THEREOF

BACKGROUND OF THE INVENTION

1. Field of the Invention

The present invention relates to a semiconductor device and manufacturing method thereof. More particularly, the present invention relates to a non-volatile memory and manufacturing method thereof.

2. Description of the Related Art

Electrically erasable programmable read only memory (EEPROM) is a type of non-volatile memory that allows multiple data writing, reading and erasing operations. Furthermore, the stored data will be retained even after power to the device is removed. With these advantages, EEPROM has been broadly applied in personal computer and electronic equipment.

A typical EEPROM has a floating gate and a control gate fabricated using doped polysilicon. To prevent data errors due to the over-erasure of EEPROM during an erase operation, an additional select gate is often set up on the sidewalls of the control gate and the floating gate and the upper surface of the substrate to form a split-gate structure.

Because some areas must be reserve to set up the split gate structure, each memory cell has a standard size greater than the stacked gate structure. Thus, increasing the level of integration of memory devices is difficult.

Furthermore, each memory cell in the split gate memory can only hold a single bit of data. With an ever-increasing size of software application programs, the demand for memory storage areas is constantly increasing. Since the conventional split-gate memory structure can hardly be miniaturized any further, the structure and/or the manufacturing method must be modified so that deep sub-micron memory devices having a larger memory storage capacity can be produced.

SUMMARY OF THE INVENTION

Accordingly, at least one objective of the present invention is to provide a non-volatile memory and manufacturing method thereof that can store two data bits inside a single memory cell unit.

At least a second objective of the present invention is to provide a non-volatile memory and manufacturing method that can increase the level of integration of devices and improve device performance.

To achieve these and other advantages and in accordance with the purpose of the invention, as embodied and broadly described herein, the invention provides a non-volatile memory. The non-volatile memory comprises a substrate, a stacked gate structure, a conductive spacer, an oxide/nitride/oxide layer, buried doping regions, a control gate and an insulating layer. The stacked gate structure is disposed on the substrate. The stacked gate structure comprises a gate dielectric layer, a select gate and a cap layer. The conductive spacer is disposed on the sidewalls of the stacked gate structure. The oxide/nitride/oxide layer is disposed between the conductive spacer and the stacked gate structure and between the conductive spacer and the substrate. The buried doping regions are disposed in the substrate outside the conductive spacer on each side of the stacked gate structure. The control gate is disposed over the stacked gate structure and electrically connected to the conductive spacer. The insulating layer is disposed between the buried doping regions and the control gate.

In the aforementioned non-volatile memory, electrons can be injected into the areas between the select gate and the bit lines (the buried doping regions) on each side of the select gate. In other words, two data bits can be stored in a single memory cell unit. Hence, the present invention is able to increase the bit storage capacity and the level of integration without increasing the volume of each memory unit.

The present invention also provides an alternative non-volatile memory. The non-volatile memory comprises a substrate, a plurality of stacked gate structures, a plurality of conductive spacers, a plurality of oxide/nitride/oxide layers, a plurality of bit lines, a plurality of word lines and a plurality of insulating layers. The stacked gate structures are set up in a first direction of extension parallel to each other over the substrate. Each stacked gate structure comprises a gate dielectric layer, a select gate and a cap layer. The conductive spacers are disposed on the sidewalls of the stacked gate structures. The oxide/nitride/oxide layers are disposed between the conductive spacers and the stacked gate structures and between the conductive spacers and the upper surface of the substrate. The bit lines are set up in the first direction of extension parallel to each other in the substrate between the conductive spacers on the stacked gate structures. The word lines are set up in a second direction of extension parallel to each other over the stacked gate structures and electrically connected to the spacers. The second direction of extension is perpendicular to the first direction of extension. The insulating layers are disposed between the bit lines and the word lines.

In the aforementioned non-volatile memory, no gaps are formed between various memory units. Hence, overall level of integration of the memory is increased. Furthermore, electrons can be injected into the areas between the select gate and the bit lines (the buried doping region) on each side of the select gate so that two bits of data can be stored within a single memory unit. In other words, the present invention is able to increase the bit storage capacity and the level of integration without increasing the volume of each memory unit.

The present invention also provides a method of fabricating a non-volatile memory. First, a substrate is provided. A plurality of stacked gate structures is formed over the substrate. The stacked gate structures comprise a gate dielectric layer, a select gate and a cap layer. An oxide/nitride/oxide layer is formed over the substrate and then conductive spacers are formed on the sidewalls of the stacked gate structures. The conductive spacers are patterned to shape into blocks. Thereafter, buried doping regions are formed in the substrate between the conductive spacers of neighboring stacked gate structures. An insulating layer is formed over the buried doping regions. A control gate is formed over the substrate and the control gate is electrically connected to the conductive spacer.

In the aforementioned method of fabricating the non-volatile memory, the process of forming a control gate over the stacked gate structures includes forming a conductive material layer over the substrate and patterning the conductive material layer to form the control gate. The control gate extends in a direction perpendicular to the select gate. Furthermore, in the process of patterning the conductive material layer, the conductive spacers are also patterned so that the conductive spacers are always formed under the control gate. After forming the conductive spacers, a portion of the oxide/nitride/oxide layer is also removed to expose the substrate.

In the aforementioned process, the stacked gate structures with conductive sidewall spacers are directly used as a self-aligned mask. Since there is no need to produce an ion mask, the processing steps are substantially simplified. Furthermore, with the conductive spacers covering the oxide/nitride/oxide layer, the oxide/nitride/oxide layer is well protected against any possible damage that might compromise the electrical performance of the device.

The present invention also provides an alternative method of fabricating a non-volatile memory. First, a substrate is provided. A plurality of stacked gate structures is formed over the substrate. The stacked gate structures comprise a gate dielectric layer, a select gate and a cap layer. An oxide/nitride/oxide layer is formed over the substrate and then spacers are formed on the sidewalls of the stacked gate structures. Thereafter, buried doping regions are formed in the substrate between the spacers on neighboring stacked gate structures and then an insulating layer is formed over the buried doping regions. The material constituting the insulating layer has an etching selectivity different from the material constituting the spacers. The spacers are removed to form a recess opening between the stacked gate structures and the insulating layer. Finally, a control gate is formed over the substrate such that the recess opening is completely filled.

In the aforementioned method of fabricating the non-volatile memory, the process of forming a control gate over the stacked gate structures includes forming a conductive material layer over the substrate and patterning the conductive material layer to form the control gate. The control gate extends in a direction perpendicular to the select gate. Furthermore, after forming the spacers, a portion of the oxide/nitride/oxide layer is also removed to expose the substrate.

In the aforementioned process, the stacked gate structures with the sidewall spacers are directly used as a self-aligned mask. Since there is no need to produce an ion mask, the processing steps are substantially simplified. Furthermore, with the conductive spacers covering the oxide/nitride/oxide layer, the oxide/nitride/oxide layer is well protected against any possible damage that might compromise the electrical performance of the device.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
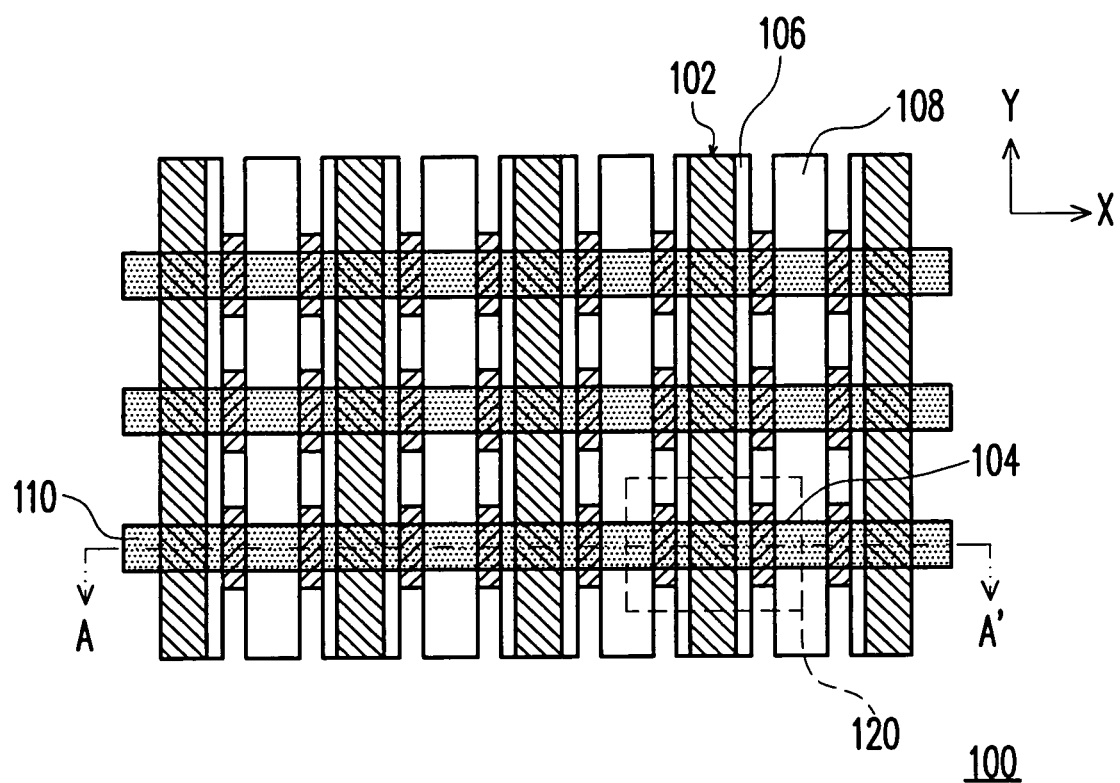
FIG. 1A is a top view of a non-volatile memory according to one preferred embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
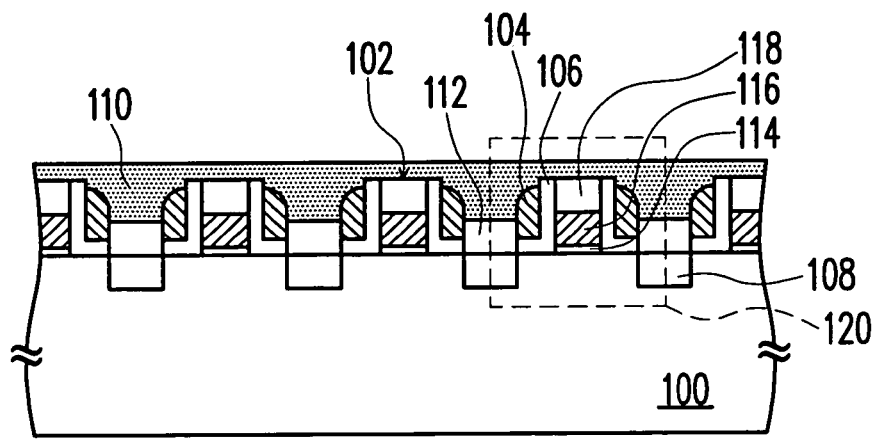
FIG. 1B is a cross-sectional view along line A-A' of FIG. 1A.

FIG. 1A is a top view of a non-volatile memory according to one preferred embodiment of the present invention. FIG. 1B is a cross-sectional view along line A-A' of FIG. 1A. In FIGS. 1A and 1B, identical components are labeled identically. As shown in FIGS. 1A and 1B, the non-volatile memory of the present invention mainly comprises a substrate, a plurality of stacked gate structures 102, a plurality of conductive spacers 104, a plurality of oxide/nitride/oxide layers 106, a plurality of bit lines (buried doping regions) 108, a word line (control gate) 110 and a plurality of insulating layers 112.

The stacked gate structures 102 are set up in a Y-direction of extension in FIG. 1A parallel to each other over the substrate 100. Each stacked gate structure 102 comprises a gate dielectric layer 114, a select gate 116 and a cap layer 118. The gate dielectric layer 114 is a silicon oxide layer, the select gate 116 is a doped polysilicon layer and the cap layer is a silicon nitride layer, for example.

The conductive spacers 104 are disposed on the sidewalls of the stacked gate structures 102 underneath word line (the control gate) 110. The conductive spacers are doped polysilicon layers, for example.

The oxide/nitride/oxide layers 106 are disposed between the conductive spacers 104 and the stacked gate structures 102 and between the conductive spacers 104 and the substrate 100. The oxide/nitride/oxide layers 106 has a first oxide layer of thickness 40 Å–60 Å, a nitride layer of thickness 55 Å–75 Å and a second oxide layer of thickness 55 Å–75 Å, for example.

The bit lines (the buried doping regions 108) are disposed in the substrate 100 along the Y-direction in parallel to each other between the conductive spacers 104 of neighboring stacked gate structures 102. Furthermore, a pair of neighboring stacked gate structures 102 each having a conductive spacer 104 uses a common bit line (buried doped region 108).

The word lines (the control gates) 110 are disposed over the stacked gate structure 102 and electrically connected to the conductive spacers 104. The word lines extend in a direction X as shown in FIG. 1A. The direction X is perpendicular to the direction Y. Therefore, the pair of neighboring bit lines 108 (the buried doping regions), the word line 110 (the control gate) that crosses over the two neighboring bit lines 108 and the stacked gate structure 102, the conductive spacers 104, the oxide/nitride/oxide layer 106 between the substrate 100 of two neighboring bit lines 108 (the buried doping regions) and the word line 110 (the control gate) together form a memory cell unit 120. In the present invention, the non-volatile memory comprises one or an array of these memory units 120.

The insulating layer 112 is disposed between the bit line 108 (the buried doping regions) and the word line 110 (the control gate).

In the aforementioned non-volatile memory, no gaps are formed between various memory units. Hence, overall level of integration of the memory is increased. Furthermore, electrons can be injected into the areas between the select gate 116 and the bit lines 108 (the buried doping regions) on each side of the select gate so that two bits of data can be stored within a single memory unit. In other words, the present invention is able to increase the bit storage capacity and the level of integration without increasing the volume of each memory unit.

Figure 2A:
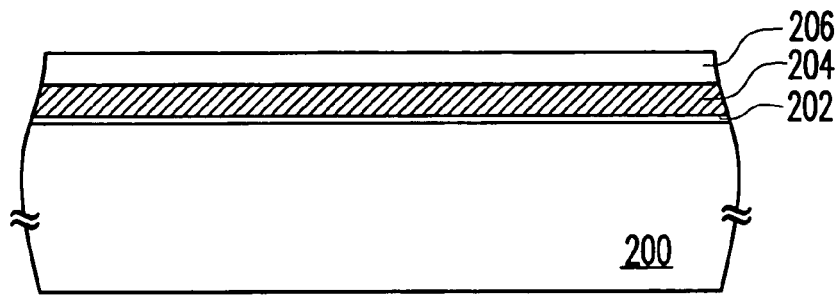
FIGS. 2A through 2E are schematic cross-sectional views along line A-A' of FIG. 1A showing the steps for fabricating a non-volatile memory according to the present invention.

FIGS. 2A through 2E are schematic cross-sectional views along line A-A' of FIG. 1A showing the steps for fabricating a non-volatile memory according to the present invention. As shown in FIG. 2A, a substrate 200 such as a silicon substrate is provided. Thereafter, a dielectric layer 202, a conductive layer 204 and a cap layer are sequentially formed over the substrate 200. The dielectric layer 202 is a silicon oxide layer formed, in a thermal oxidation process, for example. The conductive layer 204 is a doped polysilicon layer formed, for example, by performing a chemical vapor deposition process to form an undoped polysilicon layer and then performing an ion implantation afterwards. The cap layer 206 is a silicon nitride layer formed, for example, by performing a chemical vapor deposition process.

Figure 2B:
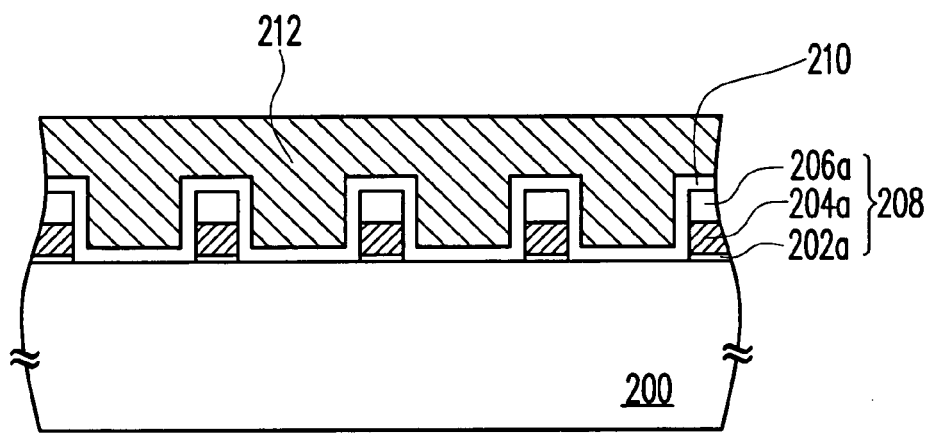

As shown in FIG. 2B, the cap layer 206, the conductive layer 204 and the dielectric layer 202 are patterned to form a gate dielectric layer 202a, a select gate 204a and a cap layer 206a. The gate dielectric layer 202a, the select gate 204a and the cap layer 206a are together to form a stacked gate structure 208.

An oxide/nitride/oxide (ONO) layer 210 is formed over the substrate 200. The oxide/nitride/oxide layer 210 is formed, for example, by performing a thermal oxidation to form a silicon oxide layer over the substrate 200. Thereafter, a chemical vapor deposition process is carried out to form a silicon nitride layer over the oxide layer. Finally, another chemical vapor deposition process is carried out to form another silicon oxide layer over the silicon nitride layer.

After that, a conductive material layer 212 is formed over the substrate 200. The conductive material layer 212 is a doped polysilicon layer formed, for example, by performing a chemical vapor deposition process to form an undoped polysilicon layer and then performing an ion implant operation to form the doped polysilicon layer.

Figure 2C:
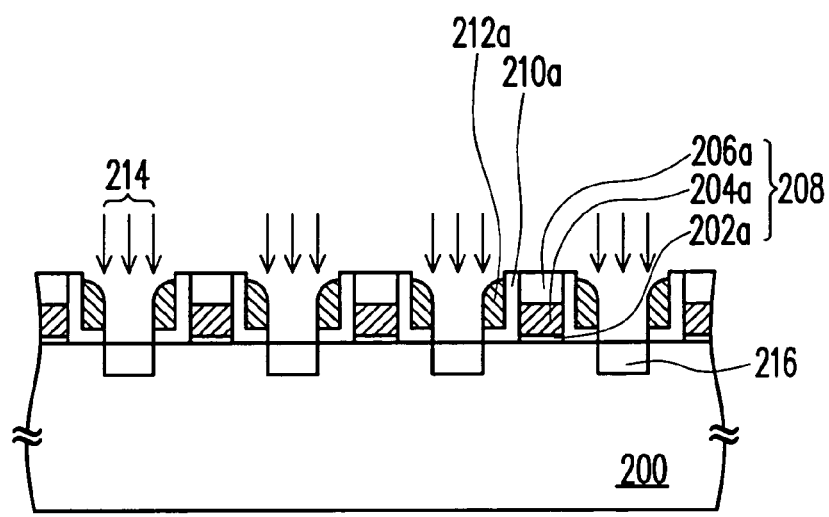

As shown in FIG. 2C, a portion of the conductive material 212 is removed to form conductive spacers 212a on the sidewalls of the stacked gate structures 208. The method of removing a portion of the conductive material 212 includes performing an anisotropic etching operation. Thereafter, the conductive spacers 212a are further patterned to form blocks. Obviously, this step may be carried out in the same subsequent process of fabricating the word lines. A portion of the oxide/nitride/oxide layer 210 is removed to expose the substrate 200 and form an oxide/nitride/oxide layer 210a. The oxide/nitride/oxide layer 210a is disposed between the conductive spacers 212a and the stacked gate structures 208 and between the conductive spacers 212a and the substrate 200.

Thereafter, a doping implant 214 is carried out to form bit lines (buried doping regions) 216 in the substrate 200. Since the stacked gate structures 208 with the conductive spacers 212a can serve as a self-aligned mask, there is no need to fabricate an ion implant mask. In addition, the conductive spacers 212a also cover the oxide/nitride/oxide layer 210a completely. Hence, any possible damage to the oxide/nitride/oxide layer 210a is minimized.

Figure 2D:
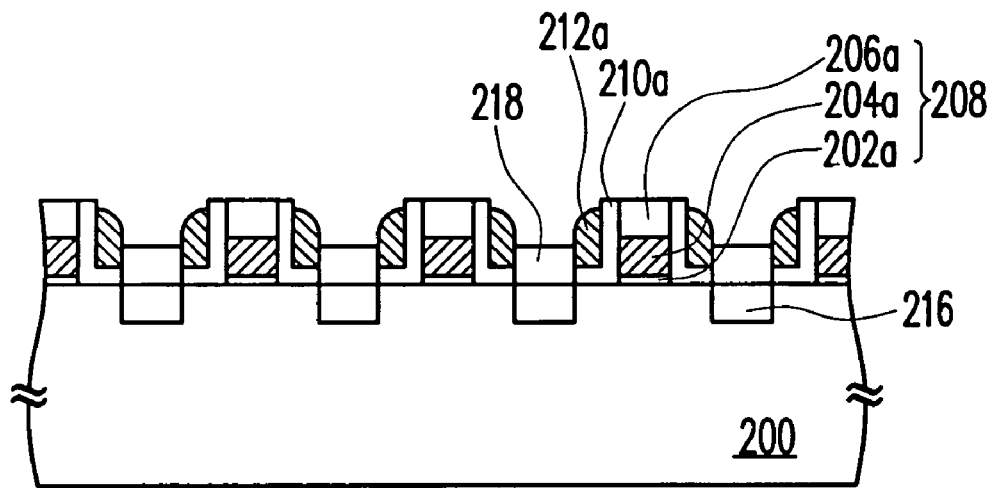

As shown in FIG. 2D, an insulating layer 218 is formed over bit lines (the buried doping regions) 216. The upper surface of the insulating layer 218 is below the top surface of the conductive spacers 212a. The insulating layer 218 is formed, for example, by forming an insulating material layer over the substrate 200 and etching back the insulating material layer so that the top surface of the insulating material layer is below the top surface of the conductive spacers 212a.

Figure 2E:
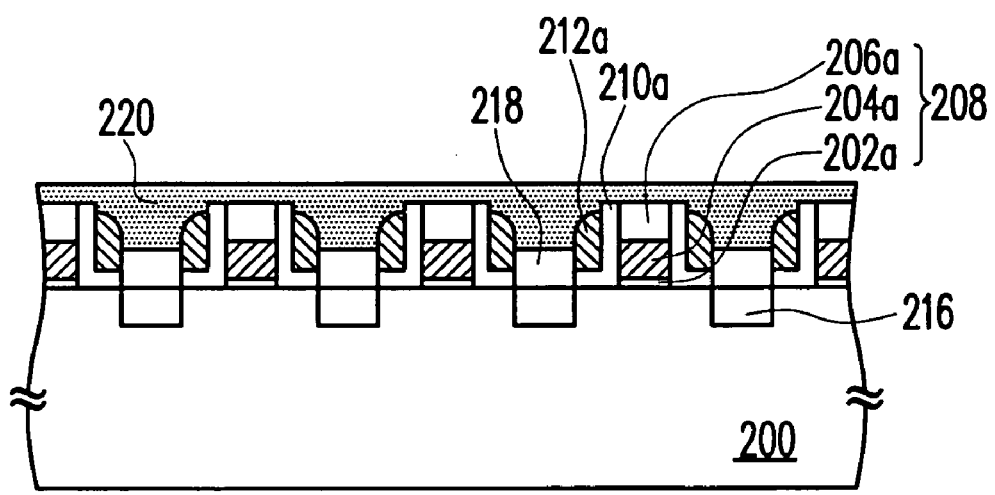

As shown in FIG. 2E, word lines (control gates) 220 are formed over the substrate 200. The word lines (the control gates) 220 and the conductive spacers 212a are electrically connected together. The word lines (the control gates) 220 are formed, for example, by depositing conductive material over the substrate and patterning the conductive material layer thereafter. The word lines (the control gates) 220 extend in a direction perpendicular to the select gates 204a. Furthermore, if no patterning process is carried out to shape the conductive spacers 212a into blocks after forming the conductive spacers 212a, the process of forming the word lines (the control gates) includes performing an etching operation. Thus, the conductive spacers 212a are in block form disposed underneath the word line (the control gates) 220.

In the aforementioned process, the stacked gate structures 208 with the conductive spacers 212a are directly used as a self-aligned mask. Since there is no need to produce an ion mask, the processing steps are substantially simplified. Furthermore, with the conductive spacers 212a covering the oxide/nitride/oxide layer 220a, the oxide/nitride/oxide layer 210a is protected against any possible damage that might compromise the electrical performance of the device.

Figure 3A:
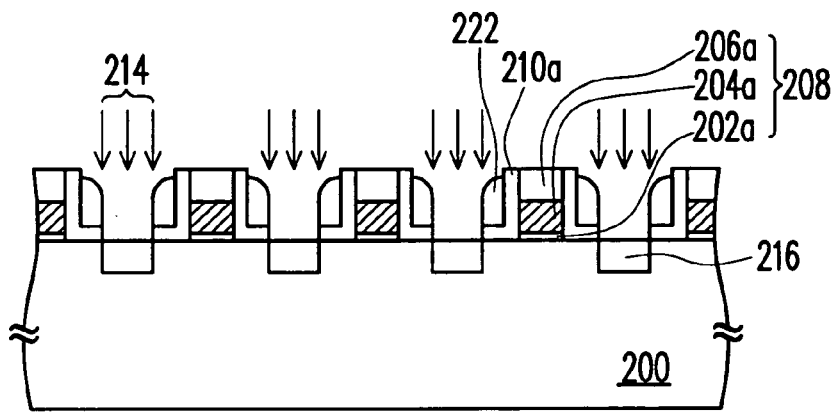
FIGS. 3A through 3C are schematic cross-sectional views showing the steps for fabricating a non-volatile memory according to a second embodiment of the present invention.
Figure 3B:
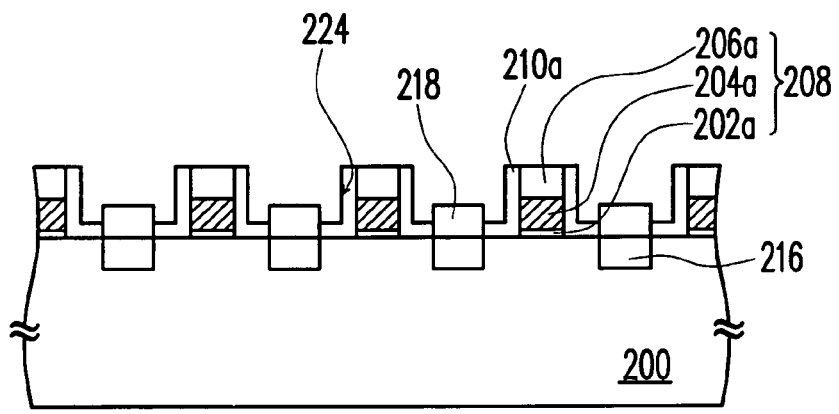
Figure 3C:
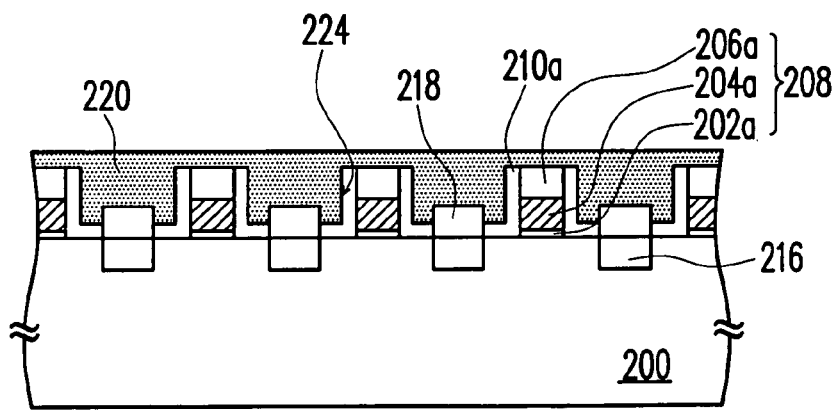

FIGS. 3A through 3C are schematic cross-sectional views showing the steps for fabricating a non-volatile memory according to a second embodiment of the present invention. In FIGS. 3A through 3C, components identical to the ones in FIGS. 2A through 2E are labeled identically. In fact, FIG. 3A is a continuation from FIG. 2. After patterning the cap layer 206, the conductive layer 204 and the dielectric layer 202 to form the gate dielectric layer 202a, the select gate 204a and the cap layer 206a, an oxide/nitride/oxide (ONO) layer 210 is formed over the substrate 200.

Thereafter, spacers 222 are formed on the sidewalls of the stacked gate structure 208. The spacers 222 are formed, for example, by depositing material over the substrate 200 to form a material layer (not shown) and removing a portion of the material layer in an anisotropic etching operation. The spacers 222 are fabricated using a material having an etching selectivity different from a subsequently formed insulating layer. After that, a portion of the oxide/nitride/oxide layer 210 is removed to form an oxide/nitride/oxide layer 210a that exposes the substrate 200. The oxide/nitride/oxide layer 210a is formed between the spacers 222 and the stacked gate structures 208 and between the spacers 222 and the substrate 200.

Thereafter, a dopant implant process 214 is carried out to form bit lines (an buried doping regions 216) in the substrate 200. In the aforementioned process, the stacked gate structures 208 and associated sidewall spacers 222 can be directly used as a self-aligned mask. Since there is no need to pre-fabricate an ion mask, the processing steps are substantially simplified. Furthermore, with the spacers 222 covering the oxide/nitride/oxide layer 210a, the oxide/nitride/oxide layer 210a is protected against most damages resulting from contact.

As shown in FIG. 3B, an insulating layer 218 is formed over the bit lines (the buried doping regions) 216. The insulating layer 218 has a top surface below the spacers 222. The insulating layer 218 is formed, for example, by depositing insulating material over the substrate 200 to form an insulating layer and etching back the insulating layer so that the top surface of the insulating layer is below the top surface of the spacer 222. Thereafter, the spacers 222 are removed to form recess openings 224 between the stacked gate structures 208 and the insulating layer 218.

As shown in FIG. 3C, word lines (control gates) 220 are formed over the substrate 200. The word lines (the control gates) 220 fill the recess openings 224 completely. The word lines (the control gates) 220 are formed, for example, by depositing conductive material over the substrate 200 to form a conductive material layer and then patterning the conductive material layer thereafter. The word lines (the control gates) 220 extend in a direction perpendicular to the select gate 204a.

In the aforementioned process, the stacked gate structures 208 and the spacers 222 are directly used as a self-aligned mask. Since there is no need to pre-fabricate an ion mask, the processing steps are substantially simplified. Furthermore, with the spacers 222 on the oxide/nitride/oxide layer 210a serving as a protective layer, possible damages to the oxide/nitride/oxide layer 210a that might compromise the electrical performance of the device are removed.

In summary, the non-volatile memory of the present invention includes no gaps between various memory units. Hence, overall level of integration of the memory is increased. Furthermore, electrons can be injected into the areas between the select gate and the bit lines (the buried doping regions) on each side of the select gate so that two bits of data can be stored within a single memory unit. In other words, the present invention is able to increase the bit storage capacity and the level of integration without increasing the volume of each memory unit. In addition, the stacked gate structures with the sidewall spacers (conductive spacers) are directly used as a self-aligned mask. Since there is no need to produce an ion mask, the processing steps are substantially simplified. Furthermore, with the conductive spacers covering the oxide/nitride/oxide layer, the oxide/nitride/oxide layer is protected against any possible damage that might compromise the electrical performance of the device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A non-volatile memory, comprising:
a substrate;
a stacked gate structure is disposed on the substrate, wherein the stacked gate structure comprises a gate dielectric layer, a select gate and a cap layer stackeded over the substrate;
a conductive spacer is disposed on the sidewalls of the stacked gate structure;
an oxide/nitride/oxide layer is disposed between the conductive spacers and the stacked gate structure and between the conductive spacers and the substrate;
a pair of buried doping regions are disposed in the substrate on each side of the stacked gate structure outside the conductive spacers;
a control gate is disposed on the stacked gate structure and electrically connected to the conductive spacer; and
an insulating layer is disposed between the buried doping region and the control gate.

2. The non-volatile memory of claim 1, wherein the thickness of the first silicon oxide, the silicon nitride layer and the second silicon oxide layer in the oxide/nitride/oxide layer are about 40 Å~60 Å, 55 Å~75 Å and 55 Å~75 Å respectively.

3. The non-volatile memory of claim 1, wherein the material constituting the conductive spacers comprises doped polysilicon.

4. The non-volatile memory of claim 1, wherein the material constituting the cap layer comprises silicon nitride.

5. The non-volatile memory of claim 1, wherein the control gate and the conductive spacers together form an integrative unit.

6. A non-volatile memory, comprising:
a substrate;
a plurality of stacked gate structures are set up in parallel along a first direction of extension over the substrate, wherein each stacked gate structure comprises a gate dielectric layer, a select gate and a cap layer sequentially stacked over the substrate;
a plurality of conductive spacers are disposed on the sidewalls of the stacked gate structures;
a plurality of oxide/nitride/oxide layer are disposed between the conductive spacers and the stacked gate structures and between the conductive spacers and the substrate;
a plurality of bit lines are set up in parallel along the first direction of extension in the substrate between the conductive spacers of neighboring stacked gate structures;
a word line are set up along a second direction of extension on the stacked gate structures and electrically connected to the conductive spacers, wherein the second direction of extension is perpendicular to the first direction of extension; and
a plurality of insulating layers are disposed between the bit lines and the word lines.

7. The non-volatile memory of claim 6, wherein the thickness of the first silicon oxide, the silicon nitride layer and the second silicon oxide layer in the oxide/nitride/oxide layer are about 40 Å~60 Å, 55 Å~75 Å and 55 Å~75 Å respectively.

8. The non-volatile memory of claim 6, wherein the material constituting the conductive spacers comprises doped polysilicon.

9. The non-volatile memory of claim 6, wherein the material constituting the cap layer comprises silicon nitride.

10. The non-volatile memory of claim 6, wherein the word line and the conductive spacers together form an integrative unit.

11. A method of manufacturing a non-volatile memory, comprising the steps of:
providing a substrate;
forming a plurality of stacked gate structures over the substrate, wherein each stacked gate structure comprises a gate dielectric layer, a select gate and a cap layer sequentially stacked over the substrate;
forming an oxide/nitride/oxide layer over the substrate;
forming conductive spacers on the sidewalls of the stacked gate structures;
patterning the conductive spacers to shape the conductive spacers into blocks;
forming buried doping regions in the substrate between the conductive spacers of neighboring stacked gate structures;
forming an insulating layer over the buried doping regions; and forming a control gate over the substrate, wherein the control gate and the conductive spacers are electrically connected.

12. The method of claim 11, wherein the step of forming the control gate over the stacked gate structures comprises:
 forming a conductive material layer over the substrate; and
 patterning the conductive material layer to form the control gate, wherein the control gate extends in a direction perpendicular to the select gate.

13. The method of claim 12, wherein the step of patterning the conductive material layer further comprises patterning the conductive spacers so that the conductive spacers are only formed under the control gate.

14. The method of claim 11, wherein after forming the conductive spacers, further comprises removing a portion of the oxide/nitride/oxide layer to expose the substrate.

15. The method of claim 11, wherein the step of forming the buried doping regions comprises performing an ion implant process.

* * * * *